(12) United States Patent
Watanabe et al.

(10) Patent No.: US 7,724,798 B2
(45) Date of Patent: May 25, 2010

(54) TWO-BEAM SEMICONDUCTOR LASER APPARATUS

(75) Inventors: Yasuhiro Watanabe, Tottori (JP); Kouji Ueyama, Tottori (JP); Shinichirou Akiyoshi, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 216 days.

(21) Appl. No.: 10/575,680

(22) PCT Filed: Oct. 12, 2004

(86) PCT No.: PCT/JP2004/015011

§ 371 (c)(1),
(2), (4) Date: Apr. 13, 2006

(87) PCT Pub. No.: WO2005/039001

PCT Pub. Date: Apr. 28, 2005

(65) Prior Publication Data

US 2006/0285476 A1    Dec. 21, 2006

(30) Foreign Application Priority Data

Oct. 15, 2003    (JP)    ............... 2003-355478

(51) Int. Cl.
H01S 5/00    (2006.01)
(52) U.S. Cl. ............ 372/50.121; 372/34; 372/36; 372/50.12; 372/50.122; 372/50.124
(58) Field of Classification Search ............ 372/34, 372/36, 50.12–50.122, 50.124, 68
See application file for complete search history.

(56) References Cited

U.S. PATENT DOCUMENTS 6,735,230 B1 *    5/2004    Tanabe et al. ............ 372/43.01

(Continued)

FOREIGN PATENT DOCUMENTS

JP    06-318763    11/1994

(Continued)

OTHER PUBLICATIONS

Japanese Office Action, with English Translation, issued in corresponding Japanese Patent Application No. 2005-514750, mailed on Jun. 19, 2007.

(Continued)

*Primary Examiner*—Minsun Harvey
*Assistant Examiner*—Yuanda Zhang
(74) *Attorney, Agent, or Firm*—McDermott Will & Emery LLP

(57)    ABSTRACT

A two-beam semiconductor laser device 10 includes: a two-beam semiconductor element LDC having a first and a second semiconductor laser elements LD1 and LD2 that can be driven independently and that are formed integrally on a substrate; and a submount 63 having, mounted on a front part thereof, the two-beam semiconductor laser element LDC with the light-emitting face thereof directed forward and having a first and a second electrode pads 64 and 65 connected to electrodes 61 and 62 of the first and second semiconductor laser element LD1 and LD2 by being kept in contact therewith. The first and second electrode pads 64 and 65 are formed to extend farther behind the two-beam semiconductor laser element LDC, and wires 14 and 16 are wire-bonded behind the two-beam semiconductor laser element LDC.

6 Claims, 10 Drawing Sheets

U.S. PATENT DOCUMENTS

| | | | |
|---|---|---|---|
| 6,757,311 B2 * | 6/2004 | Abe | 372/43.01 |
| 6,885,076 B2 | 4/2005 | Honda et al. | |
| 7,009,919 B2 * | 3/2006 | Matsuda | 369/44.41 |
| 2001/0050531 A1 * | 12/2001 | Ikeda | 313/498 |
| 2002/0021725 A1 * | 2/2002 | Abe | 372/46 |
| 2003/0231672 A1 * | 12/2003 | Komoto | 372/36 |

FOREIGN PATENT DOCUMENTS

| | | |
|---|---|---|
| JP | 10-154848 | 6/1998 |
| JP | 11-186651 | 7/1999 |
| JP | 2000-244060 | 9/2000 |
| JP | 2000-252592 | 9/2000 |
| JP | 2002-006181 | 1/2002 |
| JP | 2002-008258 | 1/2002 |
| JP | 2002-043672 | 2/2002 |
| JP | 2002-043679 | 2/2002 |
| JP | 2002-232061 | 8/2002 |
| JP | 2002-289956 | 10/2002 |
| JP | 2002-329934 | 11/2002 |
| JP | 2002-344061 | 11/2002 |
| JP | 2003-289167 | 10/2003 |

OTHER PUBLICATIONS

Chinese Office Action issued in Chinese Patent Application No. CN 200480030153.5, dated Aug. 3, 2007.

Search Report Mailed Jan. 11, 2005.

* cited by examiner

TWO-BEAM SEMICONDUCTOR LASER APPARATUS

This application is the U.S. National Phase under 35 U.S.C. §371 of International Application No. PCT/JP204/015011, filed Oct. 12, 2004, which in turn claims the benefit of Japanese Application No. 2003-355478, filed Oct. 15, 2003, the disclosures of which Applications are incorporated by reference herein in their entirety.

TECHNICAL FIELD

The present invention relates to a two-beam semiconductor laser device, and more particularly to a single-mode two-beam semiconductor laser device that employs a package composed of a frame and a resin member and that can emit laser light of two wavelengths individually.

BACKGROUND ART

As optical recording media, there have been known, among others, compact discs (CDs), recordable compact discs (CD-Rs), rewritable compact discs (CD-RWs), and as those offering higher recording densities, digital versatile discs (DVDs) and recordable DVDs. To record and play back, among these recording media, at least DVDs, CDs, CD-Rs, and CD-RWs, it is necessary to use, as the light source for optical pickups, one capable of emitting laser light of wavelengths 650 nm and 780 nm.

The laser light of a wavelength of 650 nm is for playback of DVDs, and the laser light of a wavelength of 780 nm is for playback of CDs and for recording and playback of CD-Rs and CD-RWs. The laser light of a wavelength of 650 nm may be used for recording of recordable DVDs. On the other hand, the recent demands for faster recording have been requiring higher-output light sources.

As a light source for incorporation in an optical pickup, there has been known a two-beam semiconductor laser device that can emit a laser light of wavelengths 650 nm and 780 nm from a single package. By incorporating a two-beam semiconductor laser device into an optical pickup, it is possible to make the optical pickup compact and to simplify the assembly thereof.

FIG. 6 and FIG. 7 are a front view and a perspective view respectively, showing a substantial part of a conventional two-beam semiconductor laser device. The two-beam semiconductor laser device 50 has a two-beam semiconductor laser element LDC mounted on a submount 63. The two-beam laser element LDC is integrated on a single substrate 51, with a first semiconductor laser element LD1 and a second semiconductor laser element LD2 formed separately from each other.

The substrate 51 is formed of, for example, n-type GaAs. The first semiconductor laser element LD1 is formed of, for example, an AlGaInP semiconductor, and outputs laser light of a wavelength of 650 nm. The second semiconductor laser element LD2 is formed of, for example, an AlGaAs semiconductor and outputs a laser light of a wavelength of 780 nm. The specific details of the structures of the first, AlGaInP, semiconductor laser element LD1 and the second, AlGaAs, semiconductor laser element LD2 are disclosed in Patent Publications 1 and 2, and therefore, in this respect, only a brief description thereof will be given below.

The first, AlGaInP, semiconductor laser element LD1 has an n-type AlGaInP semiconductor layer 52 formed on the n-type GaAs substrate 51. On the n-type AlGaInP semiconductor layer 52, a p-type AlGaInP semiconductor layer 53 is formed with a first junction layer 54 laid in between. The first junction layer 54 contains a single-quantum-well (SQW) or multiple-quantum-well (MQW) structure, and has part thereof formed into a first light-emitting portion 55.

Likewise, the second, AlGaAs, semiconductor laser element LD2 has an n-type AlGaAs semiconductor layer 56 formed on the n-type GaAs substrate 51. On the n-type AlGaAs semiconductor layer 56, a p-type AlGaAs semiconductor layer 57 is formed with a second junction layer 58 laid in between. The second junction layer 58 contains the same structure as the first junction layer 54, and has part thereof formed into a second light-emitting portion 59.

On the back face of the substrate 51, an n-side common electrode 60 is formed. On the top face of the first semiconductor laser element LD1, a first p-side electrode 61 is formed. On the top face of the second semiconductor laser element LD2, a second p-side electrode 62 is formed.

On the face of the submount 63 to which the two-beam semiconductor laser element LDC is fixed, a first electrode pad 64 and a second electrode pad 65 are formed separate from each other by patterning. The first and second p-side electrodes 61 and 62 of the two-beam semiconductor laser element LDC are fixed to the first and second electrode pads 64 and 65, respectively. This configuration enables the first and second semiconductor laser elements LD1 and LD2 to be driven individually.

The two-beam semiconductor laser element LDC has a so-called junction-down structure; that is, it has the first and second junction layers 54 and 58 located close to the submount 63. This enables the first semiconductor laser element LD1 and the second semiconductor laser element LD2 to dissipate heat efficiently. Thus, the submount 63 serves as a heatsink, and thereby helps stabilize the operation of and increase the output of the two-beam semiconductor laser element LDC.

Behind the two-beam semiconductor laser element LDC on the submount 63, a photodetector 66 such as a photodiode is fitted. According to what is detected by the photodetector 66, the light emission output of the two-beam semiconductor laser element LDC is controlled.

The submount 63, on which the two-beam semiconductor laser element LDC is fixed, is fixed to a heatsink plate or a leadframe (not shown), and to the n-side common electrode 60 of the two-beam semiconductor laser element LDC, a wire 67 is connected at one end thereof. One end of a wire 68 and one end of a wire 69 are connected to the first electrode pad 64 and the second electrode pad 65, respectively. One end of a wire 70 is connected to the photodetector 66. The other ends of the wires 67 to 70 are connected to lead terminals (not shown). In this way, the two-beam semiconductor laser device 50 is fabricated.

In the two-beam semiconductor laser device 50 structured as described above, the first semiconductor laser element LD1 can be driven independently by passing a current between the first p-side electrode 61 and the n-side common electrode 60; the second semiconductor laser element LD2 can be driven independently by passing a current between the second p-side electrode 62 and the n-side common electrode 60. Thus by driving the first semiconductor laser element LD1, laser light of wavelength of 650 nm can be produced, and by driving the second semiconductor laser element LD2, laser light of wavelength of 780 nm can be produced.

Known semiconductor laser devices typically use can packages or frame packages. In a semiconductor laser device using a can package, leads are fitted one-by-one to a metal stem, and a laser element is mounted on the metal stem and is sealed with a cap. In a semiconductor laser device using a frame package, a semiconductor laser element is mounted on a metal frame, and these are then insert-molded. Semiconductor laser devices using frame packages have been attracting attention for their low cost and good mass productivity.

Compared with conventionally widely used semiconductor laser devices using can packages, however, semiconductor laser devices using frame packages offer poorer heat dissipation. For this reason, semiconductor laser devices using frame packages are now mostly used for infrared laser devices. Further improvements are required so as to make semiconductor laser devices using frame packages usable as high-output laser devices for use with CD-Rs and CD-RWs, red laser devices for use with DVDs, two-wavelength laser devices, or blue laser devices operating at high operating voltages.

Patent Publication 3 discloses a semiconductor laser device using a frame package in which such an improvement has been made. FIG. 8 and FIG. 9 are a perspective view and a front view, respectively, of this type of semiconductor laser device using a frame package. FIG. 10 is a sectional view taken along line X-X' shown in FIG. 9.

In the semiconductor laser device 80, a submount 83 is arranged in a fixed position on the top face of a frame 82. A semiconductor laser element 84 is arranged in a fixed position on the top face of the submount 83. The frame 82 is formed of a metal having good thermal and electrical conductivity, such as copper, iron, or an alloy of either, and is formed into a plate. The frame 82 includes a main frame 86 on which the semiconductor laser element 84 is mounted and sub frames 87 and 88 for wiring that are independent of the main frame 86. The main frame 86 and the sub frames 87 and 88 are integrated into a frame package by being molded in a resin-molded member 85 that is electrically insulative.

The main frame 86 includes an element mount portion 86a, a lead portion 86b and wing portions 86c and 86d. On the element mount portion 86a, the submount 83 is mounted. The lead portion 86b serves as a current path. The wings 86c and 86d are formed to project to the left and right, respectively, for the purpose of heat dissipation and positioning. In the main frame 86, a thick-walled section 86e and a thin-walled section 86f are formed. The thick-walled section 86e is formed by thickening a front part of the element mount portion 86a and front parts of the wing portions 86c and 86d. The thin-walled section 86f is formed by thinning the lead portion 86b and rear parts of the wing portions 86c and 86d.

The sub frames 87 and 88 are formed to be thin-walled like the lead portion 86b. This enables the lead portion 86b and the sub frames 87 and 88 to be finely processed with ease when the frame 82 is punched out by pressing. Therefore, it is possible to make the semiconductor laser device 80 compact by keeping the intervals between the lead portion 86b and the sub frames 87 and 88 short.

The resin-molded member 85 is formed by insert molding in such a manner that it sandwiches the frame 82, from above the front face and below the back face of the frame 82. On the front face of the resin-molded member 85 is formed a laser output window 85a through which laser light is emitted, as well as an enclosure 85b that is U-shaped so as to be open frontward. Taper faces 85c are formed in front-end parts of left and right side portions of the enclosure 85b. The taper faces 85c permit the semiconductor laser device 80 to be inserted smoothly to be arranged in a predetermined position. The back face of the resin-molded member 85 is formed to be a flat surface 85d that covers the element mount portion 86a, and has substantially the same outer shape (hexagonal shape) as the enclosure 85b located on the front face of the resin-molded member 85.

The resin-molded member 85 does not cover the part of the element mount portion 86a of the main frame 86 in the enclosure 85b, nor does it cover the sub frames 87 and 88. Thus, in these locations, the surfaces of the main frame 86 and the sub frames 87 and 88 are exposed. On the exposed part of the element mount portion 86a, the semiconductor laser element 84 is arranged and fixed, with the submount 83 placed in between. Subsequently, the semiconductor laser element 84 is connected to the main frame 86 with a wire (not shown), and the submount 83 is connected to the sub frames 87 and 88 with wires (not shown).

The submount 83 is built as a light receiving element whose base material is Si. This makes it possible to monitor the light emitted from the rear face of the semiconductor laser element 84. Instead of Si, a ceramic or metal material that has high thermal conductivity may be used, such as AlN, SiC, or Cu. The submount 83 is fixed to the element mount portion 86a, for example, with a solder material such as Pb—Sn, Au—Sn, or Sn—Bi, or with Ag paste. The semiconductor laser element 84 is fixed to the submount 83, in a predetermined position thereon, for example, with a solder material such as Au—Sn or Pb—Sn, or with Ag paste.

Structured as described above, the semiconductor laser device 80 using a frame package offers the following advantages: since the surface of the semiconductor laser element 84 is exposed, it offers good heat dissipation; it has a simple structure, and is therefore suitable for mass production.

Patent Publication 1: JP-A-H11-186651 (Claims, paragraphs [0017] to [0023], FIG. 1)
Patent Publication 2: JP-A-2002-329934 (Claims, FIG. 1, FIG. 4)
Patent Publication 3: JP-A-2002-43679 (paragraphs [0010] to [0022], FIG. 1, FIG. 2, FIG. 4)

DISCLOSURE OF THE INVENTION

Problems to be Solved by the Invention

A semiconductor laser device is usually operated in single mode. In a case where a semiconductor laser device is used in an optical pickup for recording and playing back optical discs, however, it needs to be operated in multiple mode for playback to cope with return light from the optical disc. For this purpose, multiple mode is emulated by high-frequency modulation, and, when this is done, the semiconductor laser device needs to be matched with the high-frequency modulation.

Disadvantageously, the conventional semiconductor laser device 80 using a frame package disclosed in Patent Publication 3 has, for better heat dissipation and easy wire bonding, the submount 83 formed far larger than the semiconductor laser element 84. Moreover, the lead portion 85b and the sub frames 87 and 88 are located far from the submount 83 and the semiconductor laser element 84. Thus, longer wires are needed than in a semiconductor laser device using a metal can package.

When a semiconductor laser device is operated by high-frequency modulation, since the wires have varying inductances according to the length thereof, the wires need to be made as short as possible. Thus, inconveniently, the semiconductor laser device 80 cannot be stably operated by high-frequency modulation.

This inconvenience is experienced even with a two-beam semiconductor laser device if it uses a frame package. In addition, as shown in FIG. 7 described above, the two-beam semiconductor laser device 50 has the photodetector 66 arranged behind the two-beam semiconductor laser element LDC, and thus has four terminals.

This requires even longer wires to be used as the wires 67 to 69 bonded to the n-side common electrode 60 and the first and second electrode pads 64 and 65, and thus inconveniently causes the inductances thereof to vary unduly greatly.

Furthermore, the presence of the photodetector 66 makes it difficult to miniaturize the two-beam semiconductor laser device 50. Moreover, since the space behind the two-beam semiconductor laser element LDC is occupied by the photodetector 66, the wires 68 and 69 are connected to the first and second electrode pads 64 and 65 at the sides of the two-beam semiconductor laser element LDC. This makes the submount 63 unduly wide, which makes it more difficult to miniaturize the two-beam semiconductor laser device 50.

Incidentally, whereas conventional semiconductor laser elements are about 300 to 400 µm long, recent higher-output semiconductor laser elements are about 1 to 1.5 mm long, that is, they are three to five times longer than conventional ones. This makes the submount 63 is even larger. Under these circumstances, there is a need for a structure of a two-beam semiconductor laser device in which a two-beam semiconductor laser device can be made compact.

In search of a solution to the inconveniences experienced in the fabrication of a two-beam semiconductor laser device made particularly compact with a frame package as described above, the inventors of the present invention have conducted various studies, which have led to the present invention.

An object of the present invention is to provide a single-mode two-beam semiconductor laser device that permits size reduction and that can be stably operated in multiple mode.

Means for Solving the Problem

To achieve the above object, according to the present invention, a two-beam semiconductor laser device is provided with: a two-beam semiconductor element having a first and a second semiconductor laser elements that can be driven independently and that are formed integrally on a substrate; and a submount having, mounted on a front part thereof, the two-beam semiconductor laser element with a light-emitting face thereof directed forward and having a first and a second electrode pads connected to electrodes of the first and second semiconductor laser element by being kept in contact therewith. Here, the first and second electrode pads are formed to extend farther behind the two-beam semiconductor laser element and are wire-bonded behind the two-beam semiconductor laser element.

According to the present invention, in the two-beam semiconductor laser device structured as described above, the first and second electrode pads are wire-bonded at the rear end of the submount.

According to the present invention, in the two-beam semiconductor laser device structured as described above, the distance from the rear end of the two-beam semiconductor laser element to the position where the first and second electrode pads are wire-bonded is 300 µm or shorter. Theoretically, it is preferable that the lower limit value of the distance from the rear end of the two-beam semiconductor laser element to the position where the first and second electrode pads are wire-bonded be as small as possible. However, if the distance is too small, wire bonding cannot be carried out easily. Thus, the distance should be determined properly, taking into consideration the diameter of the wire and the size of the jig for wire bonding. The wire can be made short enough even if the distance is over 300 µm. However, in such a case, the size of the submount is disadvantageously large, and thus the upper limit value of the distance should be 300 µm.

According to the present invention, in the two-beam semiconductor laser device structured as described above, the lateral length of the submount is 400 µm or more but 700 µm or less. If the lateral length of the submount is less than 400 µm, wire bonding cannot be carried out easily and a short circuit is liable to occur between the two electrode pads disposed on the submount. On the other hand, if the lateral length of the submount is over 700 µm, there is no longer any advantage from the view point of miniaturization of the two-beam semiconductor laser device, and for this reason, the upper limit value of the lateral length of the submount should be 700 µm.

According to the present invention, in the two-beam semiconductor laser device structured as described above, the submount is mounted in a package composed of a frame and a resin member.

According to the present invention, the two-beam semiconductor laser device structured as described above is built as a three-terminal two-beam semiconductor laser device having three terminals.

Advantages of the Invention

According to the present invention, the first and second electrode pads are formed to extend farther behind the two-beam semiconductor laser element, and are wire-bonded behind the two-beam semiconductor laser element. This helps reduce the lateral length of the submount, and thus helps make the two-beam semiconductor device compact. In addition, since the position where the wire bonding is performed is farther behind, the wires used here can be made shorter than conventionally needed.

This permits the inductances of the wires to be made lower by about 20% than is conventionally usual. Thus, the two-beam semiconductor laser device can be stably operated in multiple mode emulated by high-frequency modulation.

According to the present invention, since the first and second electrode pads are wire-bonded at the rear end of the submount, no photodetector is arranged behind the submount, and thus the wires can be made even shorter to permit the two-beam semiconductor laser device to be stably operated in multiple mode emulated by high-frequency modulation.

According to the present invention, the distance from the rear end of the two-beam semiconductor laser element to the position where the first and second electrode pads are wire-bonded is 300 µm or less, and this helps make the submount compact. Thus, the two-beam semiconductor laser element is arranged close to the rear end of the submount 63, and this helps reduce the lengths of the wires that are connected to the two-beam semiconductor laser element. Thus, the two-beam semiconductor laser device can be stably operated in multiple mode emulated by high-frequency modulation.

According to the present invention, since the lateral length of the submount is 400 µm or more but 700 µm or less, the two-beam semiconductor laser device can be made compact, and wire-bonding can be carried out easily.

According to the present invention, the submount is mounted in a package composed of a frame and a resin member, and this permits the two-beam semiconductor laser device to be compact, inexpensive, and suitable for mass production.

According to the present invention, the two-beam semiconductor laser device is built as a three-terminal two-beam semiconductor laser device, and this helps make the two-

Figure 1:
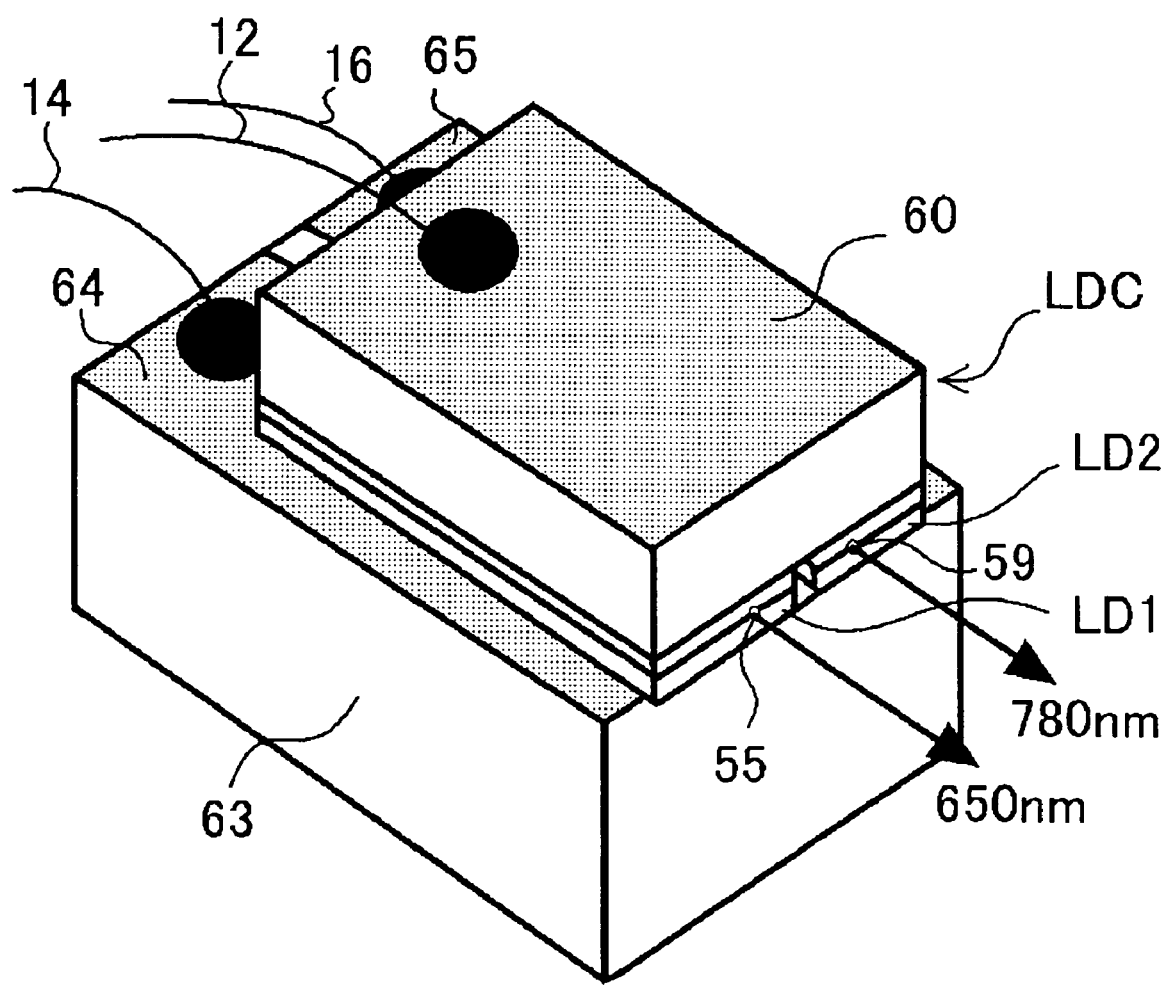
FIG. 1 A perspective view showing a two-beam semiconductor laser element of a two-beam semiconductor laser device embodying the present invention.

LIST OF REFERENCE SYMBOLS 10, 50 two-beam semiconductor laser device
12, 14, 16, 67, 68, 69 wire
22, 82 frame
23, 85 resin-molded member
24, 86 main frame
24a, 86a element mount portion
25, 26, 87, 88 sub frame
27, 85a laser output window
28, 85b enclosure
29, 29' end part
55 first light-emitting portion
59 second light-emitting portion
60 n-side common electrode
61 first p-side electrode
62 second p-side electrode
63 submount
64 first electrode pad
65 second electrode pad
66 photodetector
80 semiconductor laser device
LDC two-beam semiconductor laser element
LD1 first semiconductor laser element
LD2 second semiconductor laser element

BEST MODE FOR CARRYING OUT THE INVENTION

An embodiment of how the present invention is carried out will be described below with reference to the accompanying drawings. It should be understood, however, that the embodiment presented below is simply intended to give an example of a two beam semiconductor laser device that embodies the technical idea of the present invention, and therefore the two-beam semiconductor laser device specifically described below is not intended to limit in any way the manner in which to carry out the present invention. That is, the present invention finds wide application in the technical fields to which the appended claims are directed.

Figure 2:
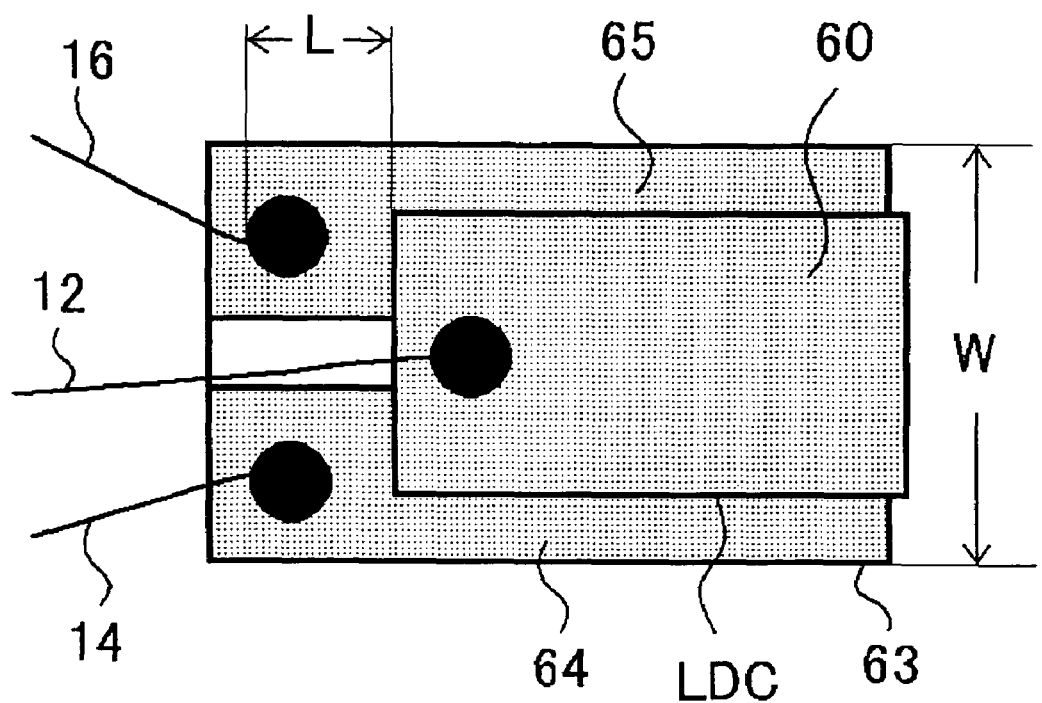
FIG. 2 A plan view showing a two-beam semiconductor laser element of a two-beam semiconductor laser device embodying the present invention.
Figure 6:
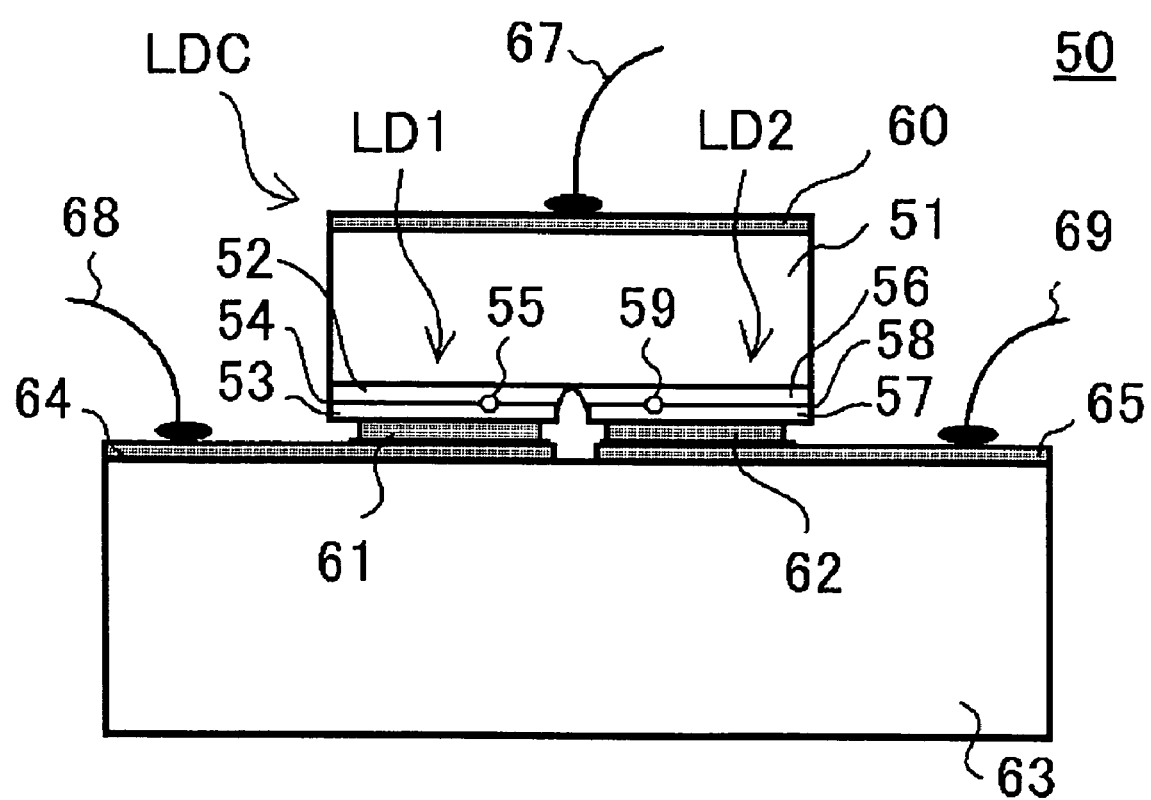
FIG. 6 A front view showing a conventional two-beam semiconductor laser element.
Figure 7:
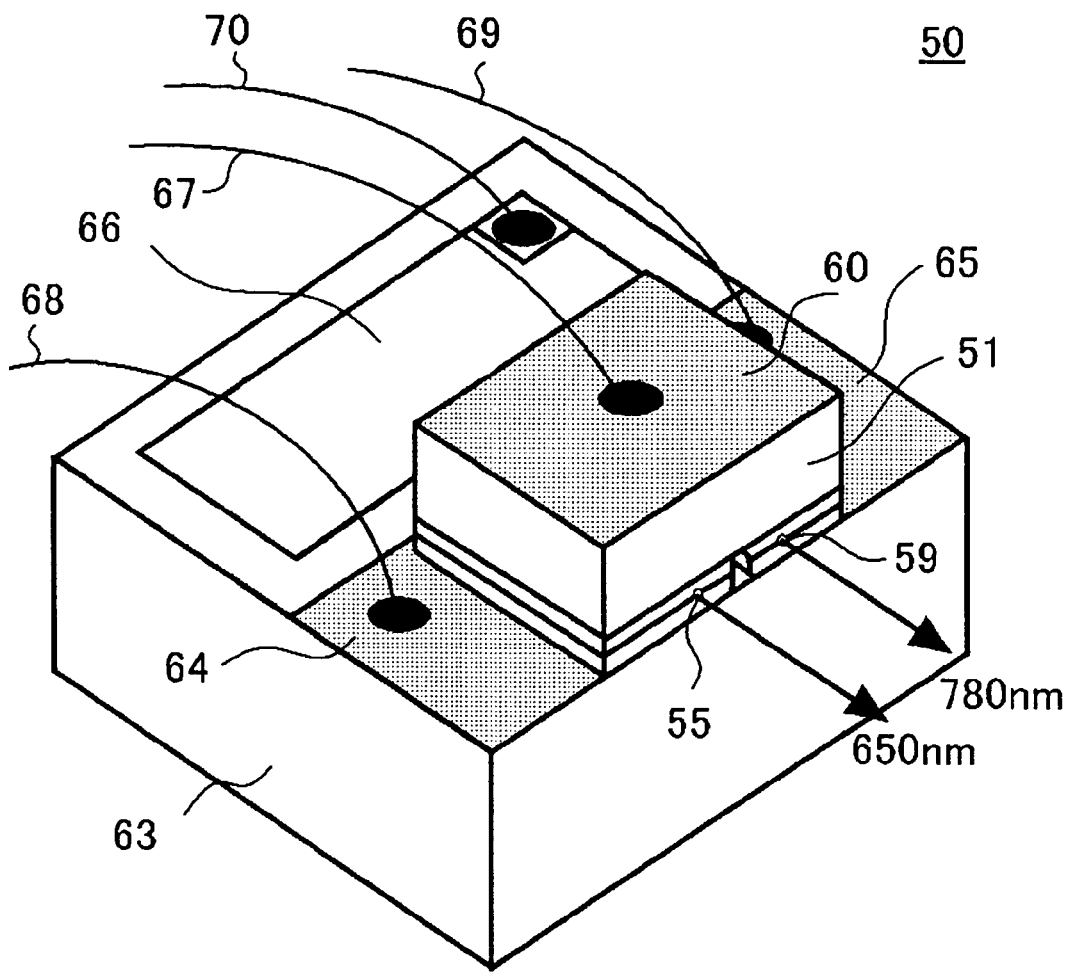
FIG. 7 A perspective view showing a conventional two-beam semiconductor laser element.
Figure 8:
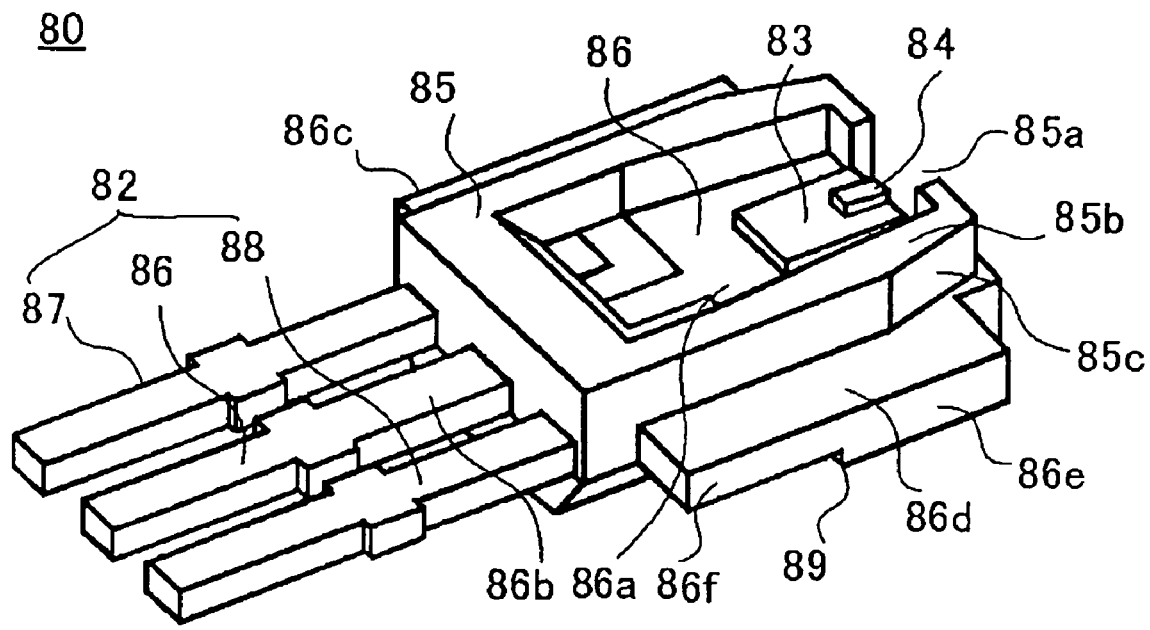
FIG. 8 A perspective view showing a conventional two-beam semiconductor laser device.
Figure 9:
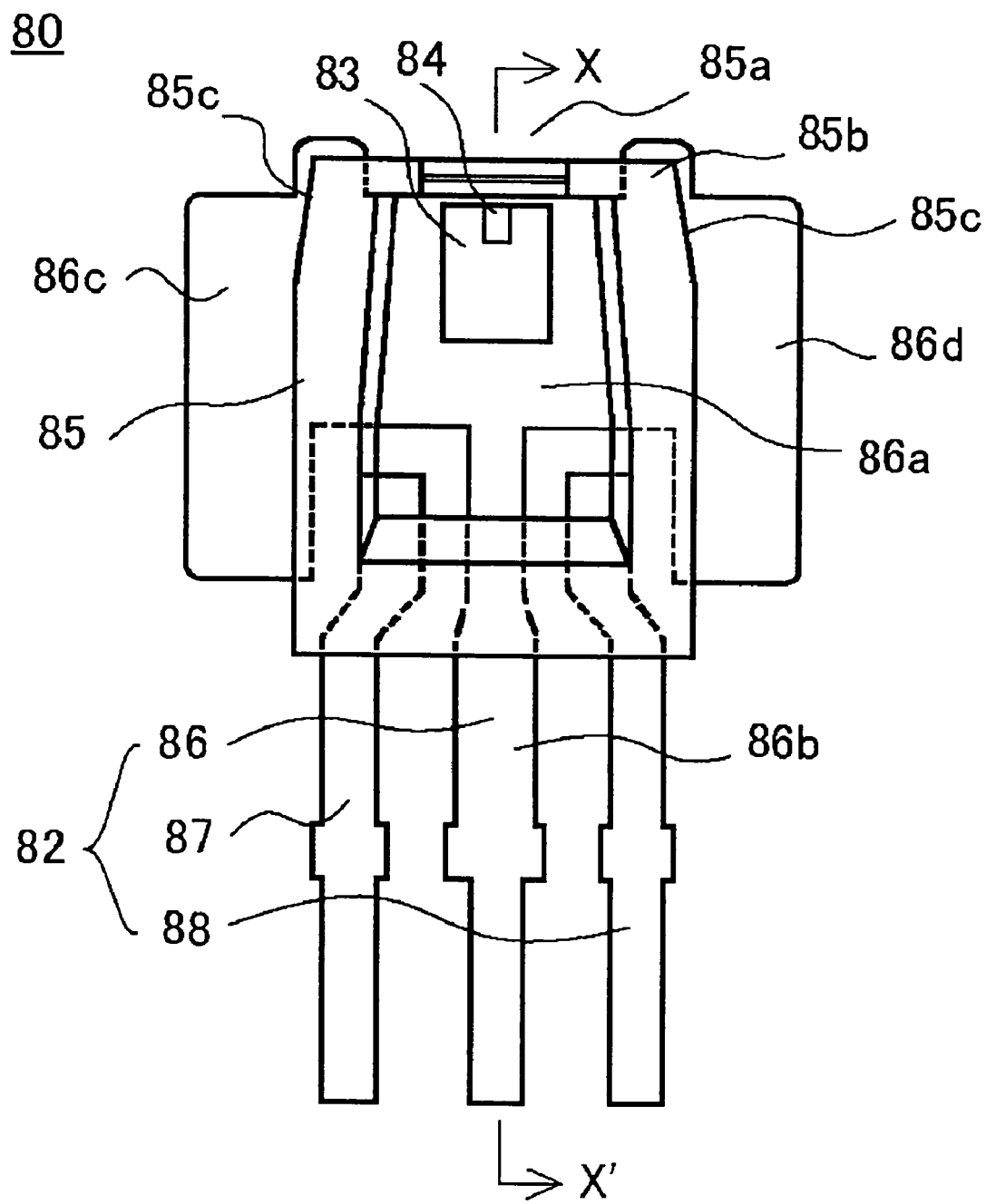
FIG. 9 A plan view of the semiconductor laser device shown in FIG. 8.
Figure 10:
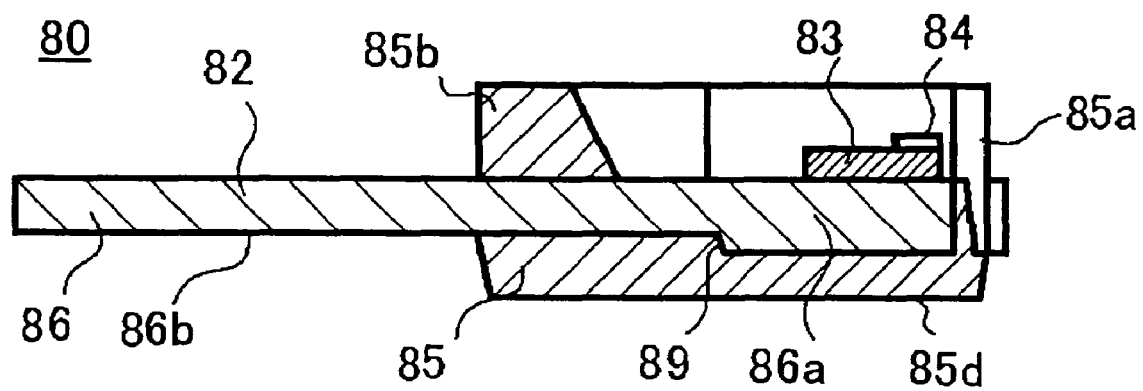
FIG. 10 A sectional view taken along line X-X' shown in FIG. 9.

FIG. 1 and FIG. 2 are a perspective view and a plan view, respectively, showing a substantial part of a two-beam semiconductor laser device embodying the present invention. For the sake of ease of description, such portions as find their counterparts in FIG. 6 and FIG. 7 described above are identified with common reference numerals, and overlapping descriptions will not be repeated. The two-beam semiconductor laser element LDC has a junction-down structure where a junction portion that includes a first and a second light-emitting portions 55 and 59 is fixed close to a submount 63.

A first semiconductor laser element LD1 that emits laser light of a wavelength of 650 nm for recordable DVDs is arranged on the left side as seen from the front in FIG. 1. A second semiconductor laser element LD2 that emits laser light of a wavelength of 780 nm for CDs/CD-Rs is placed on the right side as seen from the front in FIG. 1. Between the first and second semiconductor laser elements LD1 and LD2 is formed a groove to separate them from each other.

The submount 63 is formed of a ceramic or metal material that has high thermal conductivity, such as AlN, SiC, Cu, or Si. On the top face of the submount 63 are disposed a first and a second electrode pads 64 and 65 that are formed by patterning of Ti—Pt—Au. A first p-side electrode 61 (see FIG. 6) is disposed right under a first light-emitting portion (waveguide) 55 of the first semiconductor laser device LD1, and is fixed with solder such as Au—Sn onto the first electrode pad 64.

Likewise, a second p-side electrode 62 (See FIG. 6) is disposed right under a second light-emitting portion (waveguide) 59 of the second semiconductor laser device LD2, and is fixed with solder such as Au—Sn onto the second electrode pad 65.

This enables the heat generated at the first and second semiconductor elements LD1 and LD2 to be efficiently conducted to the submount 63 via the first and second electrode pads 64 and 65, and then dissipated.

The two-beam semiconductor laser element LDC and the submount 63 are each formed in the shape of a flat box that is elongate in the direction of the emission of laser light. The lateral length W of the submount 63 is equal to or slightly larger than the lateral length of the two-beam semiconductor laser element LDC.

The submount 63 is extended in the direction pointing away from the main-laser-light-emitting face of the two-beam semiconductor laser element LDC. In this way, the two-beam semiconductor laser element LDC is arranged on a front part of the submount 63 with the light-emitting face of the former facing forward, and a rear part of the submount 63 serves as an wire bonding area.

Incidentally, in the submount 63 of this embodiment, no photodetector 66 for monitoring (see FIG. 7) as used in the conventional example is disposed. In a high-output semiconductor laser element, to enhance the output of laser light, the face pointing away from the laser-light-emitting direction is given a higher reflectivity. This helps reduce the amount of laser light emitted backward, and thus eliminates the need to bother to integrate the photodetector 66 into the submount 63. That is, the photodetector 66 may be omitted.

At the rear end of the submount 63, to the first and second electrode pads 64 and 65, one ends of wires 14 and 16 for electrically connecting them to lead terminals (25 and 26, see FIG. 3) are wire-bonded. To an n-side common electrode 60 formed on the back face of the two-beam semiconductor laser element LDC, one end of a wire 12 for electrically connecting the n-side common electrode to a lead terminal (24b, see FIG. 3) is wire-bonded.

The wires 14 and 16 are wire-bonded where the distance L from the rear end of the semiconductor laser element LDC is 300 μm or less. The shorter the distance L is, the shorter the submount 63 can be made. Therefore, the two-beam semiconductor laser element LDC is disposed close to the rear end of the submount 63, and thus the wire 12 can be made short. The distance L may be determined properly taking into consideration the diameters of the wires 14 and 16 and the size of the jig for wire bonding such as an automatic bonder.

The lateral length W of the submount 63 may be determined taking into consideration the width of the first and second electrode pads 64 and 65, and the distance between the first and second electrode pads 64 and 65. The width of the first and second electrode pads 64 and 65 is properly determined taking into consideration the diameters of the wires 14 and 16 and the size of the jig for wire bonding such as an automatic bonder. The distance between the first and second electrode pads 64 and 65 should be long enough to achieve electrical separation between them. This helps reduce the lateral length W of the submount 63 to as small as about 400 μm in this embodiment. It is preferable that the lateral length W of the submount 63 be about 700 μm at most, though there is no specific reason that this should be so.

Figure 3:
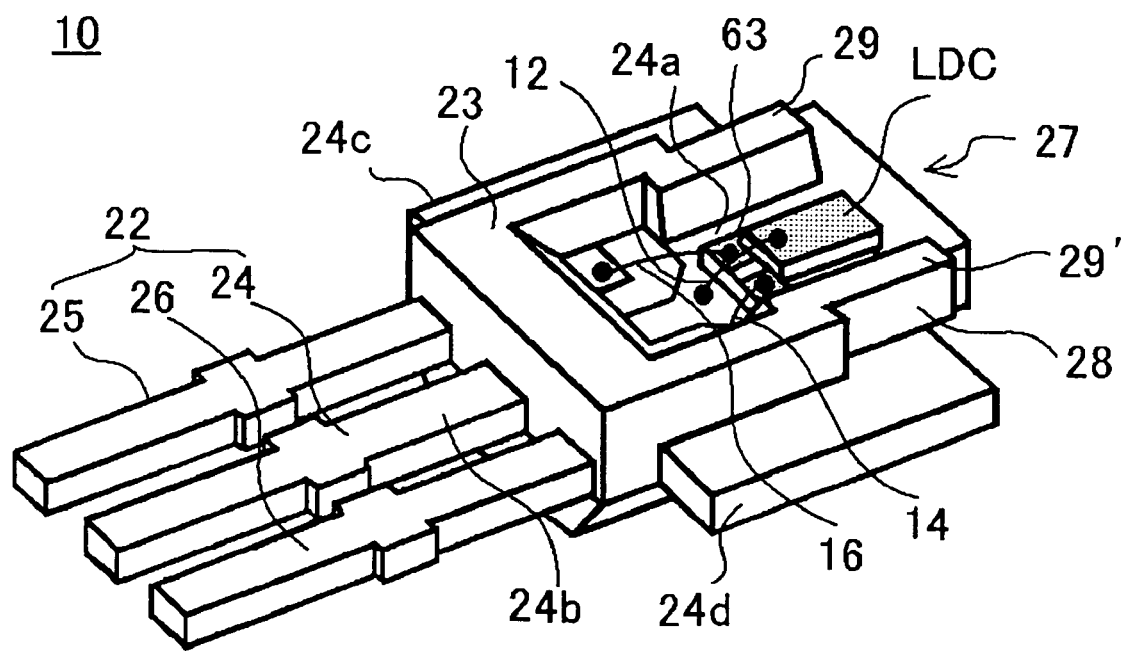
FIG. 3 A perspective view showing a two-beam semiconductor laser device embodying the present invention.
Figure 4:
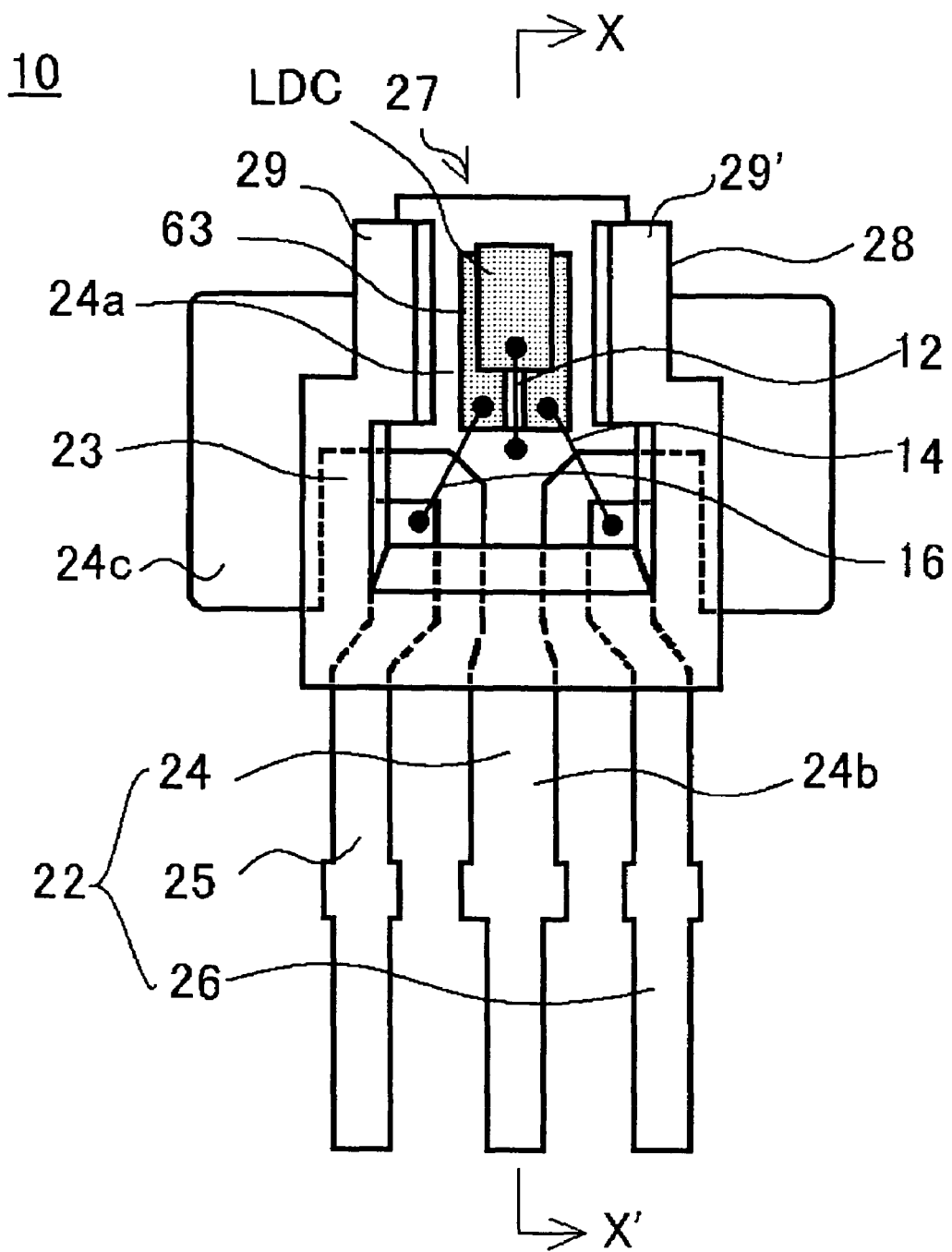
FIG. 4 A plan view showing a two-beam semiconductor laser device embodying the present invention.
Figure 5:
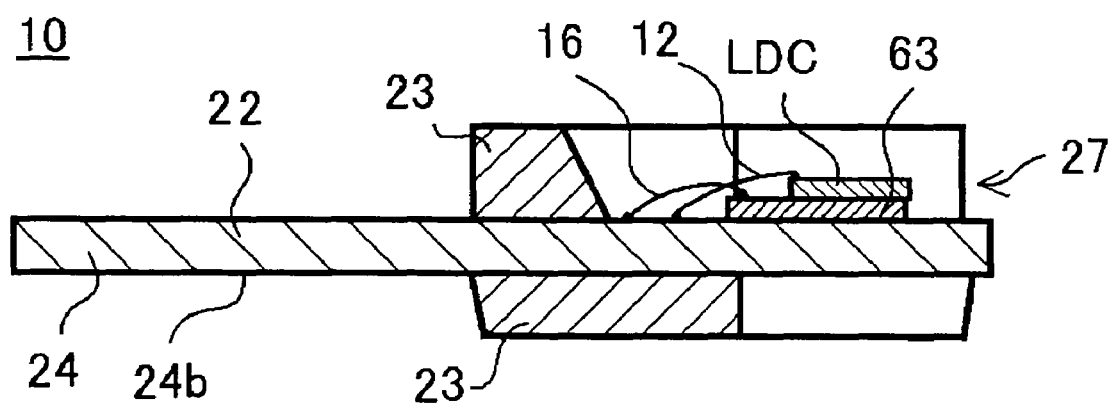
FIG. 5 A sectional view taken along line X-X' shown in FIG. 4.

FIG. 3 and FIG. 4 are a perspective view and a front view, respectively, of the two-beam semiconductor laser device of this embodiment. FIG. 5 is a sectional view taken along line X-X' shown in FIG. 4. In the two-beam semiconductor laser device 10, the two-beam semiconductor laser element LDC and the submount 63 are mounted in a frame package composed of a three-terminal frame and a resin member.

In the two-beam semiconductor laser device 10, the submount 63 is arranged and fixed on the top face of a frame 22. On the top face of the submount 63, the two-beam semiconductor laser element LDC is arranged and fixed.

The frame 22 is formed of a metal having good thermal and electrical conductivity, such as copper, iron, or an alloy of either, and is formed into a plate. In addition, the frame 22 includes a main frame 24 on which the two-beam semiconductor laser element LDC is mounted and sub frames 25 and 26 for wiring that are independent of the main frame 24. The main frame 24 and the sub frames 25 and 26 are integrated into a frame package by being molded in a resin-molded member 23 that is electrically insulative.

The main frame 24 has an element mount portion 24a, a lead portion 24b, and wings 24c and 24d. On the element mount portion 24a, the submount 63 is mounted.

The lead portion 24b serves as a current path. The wings 24c and 24d are formed to project to the left and right, respectively, for the purpose of heat dissipation and positioning.

The lead portion 24b and the sub frames 25 and 26 are formed to be thin-walled, and this enables them to be finely processed with ease when the frame 22 is punched out by pressing. Therefore, it is possible to make the semiconductor laser device 10 compact by keeping the intervals between the lead portion 24b and the sub frames 25 and 26 short.

The resin-molded member 23 is formed by insert molding in such a manner that it sandwiches the frame 22, from above the front face and below the back face of the frame 22. On the front face of the resin-molded member 23 is formed an enclosure 28 that has a laser output window 27 through which laser light is emitted and that is U-shaped so as to be open frontward. The front part of the enclosure 28 has a smaller width than the rear part thereof, and end parts 29 and 29' disposed at the either end of the front part of the enclosure 28 extend parallel to the optical axis of the two-beam semiconductor laser element LDC. The end parts 29 and 29' with a smaller width in between than the rear part of the enclosure 28 permit the two-beam semiconductor laser device 10 to be inserted smoothly to be arranged in a predetermined position.

The back face of the resin-molded member 23 is so formed as to expose the part of the back face of the main frame 24 facing the submount 63 so as to enclose that part. This helps enhance heat dissipation efficiency.

The resin-molded member 23 does not cover the part of the element mount portion 24a of the main frame 24 in the enclosure 28, nor does it cover the sub frames 25 and 26. Thus, in these locations, the surfaces of the main frame 24 and the sub frames 25 and 26 are exposed. On the exposed part of the element mount portion 24a, the semiconductor laser element LDC is arranged and fixed, with the submount 63 placed in between. Subsequently the two-beam semiconductor laser element LDC is connected to the lead portion 24b with the wire 12, and the submount 63 is connected to the sub frames 25 and 26 with the wires 14 and 16. Incidentally, the submount 63 is fixed to the frame 24, for example, with a solder material such as Pb—Sn, Au—Sn, or Sn—Bi, or with Ag paste.

In the above structured two-beam semiconductor laser device 10, the first and second electrode pads 64 and 65 are formed to extend farther behind the two-beam semiconductor laser element LDC and are wire-bonded behind the two-beam semiconductor laser element LDC. This helps make the lateral length W of the submount 63 far smaller than in the conventional example shown in FIG. 7, and thereby to make the two-beam semiconductor device compact.

Furthermore, since the position where the wire bonding is performed is farther behind, the wire 14 used between the first electrode pad 64 and the sub frame 26 and the wire 16 used between the second electrode pad 65 and the sub frame 25 can be made shorter than conventionally needed. This permits the inductances of the wires 14 and 16 to be made lower than is conventionally usual. Thus, the two-beam semiconductor laser device 10 can be stably operated in multiple mode emulated by high-frequency modulation. Moreover, since no photodetector is arranged behind the submount 63, the first and second electrode pads 64 and 65 are wire-bonded at the rear end of the submount 63. Thus, the wires 14 and 16 can be made even shorter.

In addition, the position where wire bonding is performed is close to the rear end part of the two-beam semiconductor laser element LDC. This permits the two-beam semiconductor laser element LDC to be disposed close to the rear end of the submount 63, and thus helps shorten the length of the wire 12 that connects the two-beam semiconductor laser element LDC to the main frame 24. Thus, the two-beam semiconductor laser device can be more stably operated in multi mode emulated by high-frequency modulation.

The two-beam semiconductor laser device 10 fabricated according to this embodiment is used as a three-terminal high-output two-wavelength semiconductor laser device. The size of the two-beam semiconductor laser device 10 is as follows: the width of the package at the front end thereof (the width of the enclosure 28 as measured at the end parts 29 and 29' in FIG. 3 and FIG. 4) is 2.7 mm, the rear end width is 3.8 mm, and the length is 3.5 mm.

In contrast, it cannot be helped that a conventional high-output two-wavelength semiconductor laser device, even if mounted in a three-terminal package without taking the photodetector into consideration, is large-sized to secure a space that accepts the lateral length of the submount and that permits assembly. Thus, the smallest dimensions possible are:

the width of the package at the front end thereof is 3.8 mm, the rear end width is 3.8 mm, and the length is 3.5 mm.

According to this embodiment, the wire bonding area at the side of the submount 63 can be ignored, and thus a compact package is realized that is smaller both in the front end width and in the area by about 30% as compared with conventional examples. In addition, it has been observed and confirmed that by making the wires 12, 14, and 16 shorter, the inductances of the wires can be made lower by about 20% than is conventionally usual.

INDUSTRIAL APPLICABILITY

The two-beam semiconductor laser device according to the present invention can be used for optical pickups that emit laser light of a plurality of wavelengths for recording or playback of DVDs, recordable DVDs, CDs, CD-Rs, or CD-RWs.

The invention claimed is:

1. A two-beam semiconductor laser device comprising:
   a two-beam semiconductor element having first and second semiconductor laser elements that can be driven independently and that are formed integrally on a substrate; and
   a submount having, mounted on a front part thereof, the two-beam semiconductor laser element with a light-emitting face thereof directed forward and having first and second electrode pads connected to electrodes of the first and second semiconductor laser elements by being kept in contact therewith,
   wherein no photodetector is provided on the submount,
   wherein the first and second electrode pads are formed to extend farther behind the two-beam semiconductor laser element, and are wire-bonded behind the two-beam semiconductor laser element at positions directly behind the two-beam semiconductor laser element with respect to a laser-light-emitting direction of the two-beam semiconductor element, and
   wherein a lateral width of the submount along the front part of the submount is 400 μm or more but 700 μm or less.

2. The two-beam semiconductor laser device of claim 1, wherein the first and second electrode pads are wire-bonded at a rear end of the submount.

3. The two-beam semiconductor laser device of claim 1, wherein a distance from the rear end of the two-beam semiconductor laser element to a position where the first and second electrode pads are wire-bonded is 300 μm or shorter.

4. The two-beam semiconductor laser device of claim 1, further comprising:
   a metal frame;
   wherein the submount is mounted directly on the frame, and
   no photodetector is directly mounted on the frame.

5. The two-beam semiconductor laser device of claim 4, wherein the two-beam semiconductor laser device is built as a three-terminal two-beam semiconductor laser device having only three terminals.

6. The two-beam semiconductor laser device of claim 4, further comprising:
   three bonding wires, each bonded to a location behind the submount and to one of an electrode of the two-beam semiconductor element, the first electrode pad, and the second electrode pad.

* * * * *